United States Patent
Nataraj et al.

[11] Patent Number: 6,166,939
[45] Date of Patent: Dec. 26, 2000

[54] METHOD AND APPARATUS FOR SELECTIVE MATCH LINE PRE-CHARGING IN A CONTENT ADDRESSABLE MEMORY

[75] Inventors: Bindiganavale S. Nataraj, Cupertino; Varadarajan Srinivasan, Los Altos Hills; Sandeep Khanna, Santa Clara, all of Calif.

[73] Assignee: Net Logic Microsystems, Mountain View, Calif.

[21] Appl. No.: 09/351,541

[22] Filed: Jul. 12, 1999

[51] Int. Cl.$^7$ .................................................. G11C 15/00
[52] U.S. Cl. .................. 365/49; 365/189.07; 365/189.11
[58] Field of Search ................................ 365/49, 189.07, 365/189.11, 203

[56] References Cited

U.S. PATENT DOCUMENTS

| | | | |
|---|---|---|---|
| 4,523,301 | 6/1985 | Kadota et al. | 365/49 |
| 5,359,564 | 10/1994 | Liu et al. | 365/49 |
| 5,483,480 | 1/1996 | Yoneda | 365/49 |
| 5,517,441 | 5/1996 | Dietz et al. | 365/49 |
| 5,564,052 | 10/1996 | Nguyen et al. | 395/800 |
| 5,617,348 | 4/1997 | Maguire | 365/49 |
| 5,706,224 | 1/1998 | Srinivasan et al. | 365/49 |
| 5,893,931 | 4/1999 | Peng et al. | 711/206 |
| 5,978,246 | 11/1999 | Shindo | 365/49 |
| 6,000,008 | 12/1999 | Simcoe | 711/108 |
| 6,044,005 | 3/2000 | Gibson et al. | 365/49 |

*Primary Examiner*—Richard Elms
*Assistant Examiner*—Hien Nguyen
*Attorney, Agent, or Firm*—William L. Paradice, III

[57] ABSTRACT

Match line control circuits are used to selectively charge corresponding match lines in response to the valid bits. If the valid bit is asserted, thereby indicating the valid data is stored in the CAM row, the match line control circuit pre-charges the match line to enable the match line to be responsive to compare operation between a comparand word and data stored in the row. If the valid bit is de-asserted, thereby indicating that any data stored in the row is invalid, the match line control circuit disables the match line by forcing a mismatch condition between the comparand word and data stored in the row. In one embodiment, the match line control circuit includes a pull-up transistor coupled between the match line and a supply voltage and having a gate responsive to the valid bit. In other embodiments, the match line control circuit further includes a pull-down transistor coupled between the match line and a supply voltage and having a gate responsive to a complement of the valid bit.

28 Claims, 4 Drawing Sheets

METHOD AND APPARATUS FOR SELECTIVE MATCH LINE PRE-CHARGING IN A CONTENT ADDRESSABLE MEMORY

BACKGROUND

1. Field of Invention

This invention relates generally to content addressable memories.

2. Description of Related Art

Content addressable memories (CAMs) are frequently used for address look-up functions in Internet data routing. For example, routers used by local Internet Service Providers (ISPs) typically include one or more CAMs for storing a plurality of Internet addresses and associated data such as, for instance, corresponding address routing information. When data is routed to a destination address, the destination address is compared with all CAM words, e.g., Internet addresses, stored in the CAM array. If there is a match, routing information corresponding to the matching CAM word is output and thereafter used to route the data.

A CAM includes an array of memory cells arranged in a matrix of rows and columns. Each memory cell stores a single bit of digital information, where the bits stored in a row of memory cells constitute a CAM word. During compare operations, a comparand word is received at appropriate input terminals of the CAM and then compared with all the CAM words. For each CAM word that matches the comparand word, a corresponding match line signal is asserted to indicate a match condition. If any of the match line signals are asserted, a match flag is asserted, and the index or address of the matching CAM word is read from the CAM. If there are multiple matches, a multiple match flag is asserted.

Each row of the CAM array includes an additional memory cell for storing a valid bit indicative of whether a valid word is stored in that row. The valid bits are used to control which words stored in the CAM array "participate" in the compare operation with the comparand word. When a valid bit is asserted, the result of a compare operation between the comparand word and data stored in the corresponding row affects assertion of the match flag for the array. That is, when the valid bit is asserted, a match condition between the comparand word and the corresponding data results in assertion of the match flag. Conversely, when the valid bit is de-asserted, the match line is de-asserted and the result of the compare operation does not affect assertion of the match flag. Thus, data is invalidated by de-asserting the corresponding valid bit.

The valid bits are also used to generate a full flag indicative of whether the CAM array is full. A de-asserted full flag indicates that at least one of the rows in the CAM array is available and, conversely, an asserted full flag indicates that there are no available rows in the array (i.e., the array is full).

FIG. 1 shows a typical CAM row 1 as having n CAM cells 10(1)–10(n) to store an n-bit CAM word, and also includes a valid bit cell 15 for storing the valid bit for the row 1. The CAM cells 10(1)–10(n) and valid bit cell 15 are each coupled to an associated match line ML. A weak pull-up transistor 16 is coupled between a supply voltage $V_{DD}$ and the match line ML. The transistor 16 has a gate tied to ground potential, and therefore remains in a conductive state.

During compare operations between an n-bit comparand word and an n-bit CAM word stored in the CAM cells 10(1)–10(n) of the row 1, the match line ML corresponding to the CAM row 1 is pre-charged to the supply voltage $V_{DD}$ via the weak pull-up transistor 16. The n-bits of the comparand word are compared with corresponding bits of the CAM word in respective CAM cells 10(1)–10(n). If all bits of the comparand word match corresponding bits of the CAM word stored in the row 1, the match line ML remains charged at approximately $V_{DD}$, thereby indicating a match condition for the row 1. If, however, any of the comparand bits does not match its corresponding CAM bit, the associated CAM cell 10 pulls the match line ML toward ground potential, thereby indicating a mismatch condition for the row 1.

During the compare operation between the comparand word and data stored in the row 1, the valid bit stored in the valid cell 15 is compared to a reference bit in a manner similar to that described above with respect to the CAM cells 10(1)–10(n). Typically, the reference bit is set to an asserted state. Thus, when the valid bit stored in the valid bit cell 15 is asserted and therefore matches the reference bit, the valid bit cell 15 does not discharge the match line ML, thereby allowing the match line ML to indicate the result of the compare operation between the comparand word and CAM word. Conversely, when the valid bit is de-asserted and therefore does not match the reference bit, the valid bit cell 15 pulls the match line ML toward ground potential, thereby forcing a mismatch condition between the comparand word and the CAM word. In this manner, the de-asserted valid bit precludes a match condition between the comparand word and the CAM word from affecting assertion of the match flag, thereby invalidating the CAM word.

As described above, the match lines ML of a typical CAM array are automatically pre-charged to the supply voltage $V_{DD}$ for each compare operation, irrespective of whether each row contains valid data. Thus, when the row 1 contains invalid data, as indicated by the valid bit stored in the valid bit cell 15, the corresponding match line ML is unnecessarily charged and then discharged during every compare operation. Current flow associated with this unnecessary charging and discharging of such match lines results in undesirable power consumption. When CAM arrays are only partially full at any given time, this undesirable power consumption may become significant.

SUMMARY

A method and apparatus are disclosed that have the intended advantage of reducing power consumption in a CAM array. In accordance with the present invention, match line control circuits are used to selectively charge corresponding match lines in response to the valid bits. If a valid bit is asserted, thereby indicating the valid data is stored in the corresponding CAM row, the match line control circuit pre-charges the match line to enable the match line to be responsive to a compare operation between a comparand word and data stored in the row. If the valid bit is de-asserted, thereby indicating that data stored in the corresponding row is invalid, the match line control circuit disables the match line by not charging the match line, thereby forcing a mismatch condition. By pre-charging only the match lines which correspond to rows having valid data stored therein, present embodiments advantageously reduce power consumption during compare operations.

In one embodiment, the match line control circuit includes a pull-up transistor coupled between the match line and a supply voltage and having a gate responsive to the valid bit. In other embodiments, the match line control circuit also includes a pull-down transistor coupled between the match line and a second supply voltage and having a gate responsive to the valid bit.

BRIEF DESCRIPTION OF THE DRAWINGS

Like reference numerals refer to corresponding parts throughout the drawing figures.

DETAILED DESCRIPTION

Embodiments of the present invention are discussed below in the context of a row of CAM cells 10 for simplicity only. It is to be understood that embodiments of the present invention are equally applicable to other content addressable memories having other configurations and/or employing any suitable CAM cells including, for example, ternary CAM cells. Further, the logic levels assigned to various signals in the description below are arbitrary and, thus, may be modified (e.g., reversed polarity) as desired. Accordingly, the present invention is not to be construed as limited to specific examples described herein but rather includes within its scope all embodiments defined by the appended claims.

Figure 2:
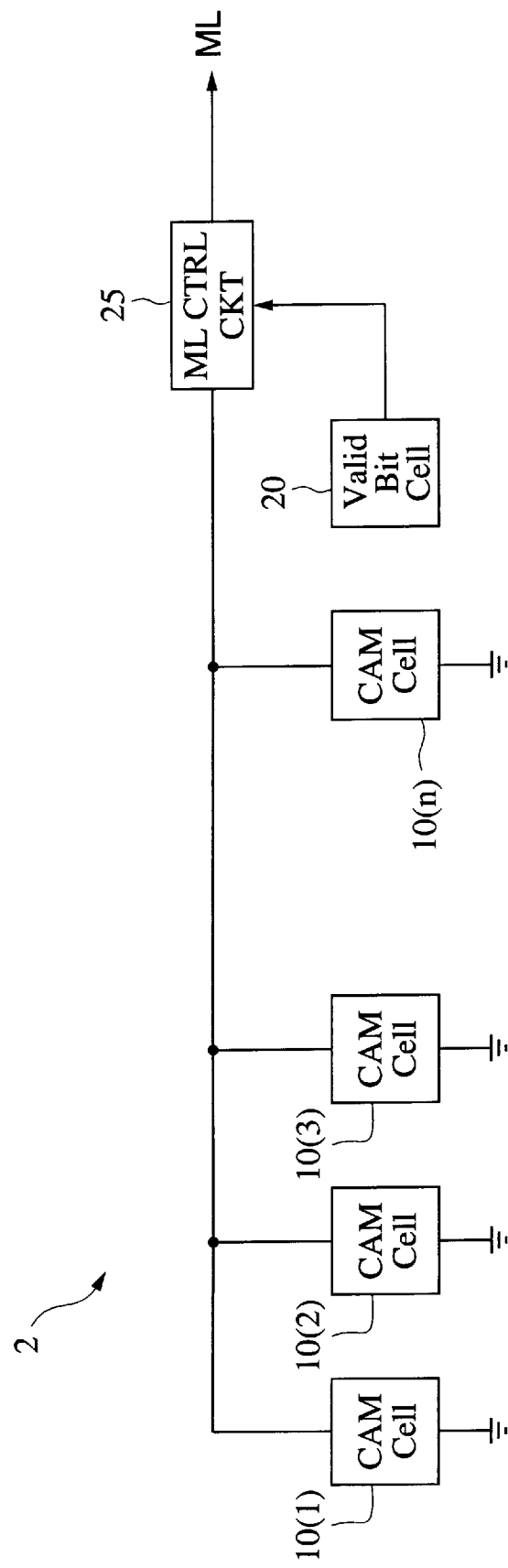
FIG. 2 is a block diagram a row of a CAM array and associated match line control circuit in accordance with one embodiment of the present invention.

FIG. 2 shows a row of a CAM in accordance with one embodiment of the present invention. The row 2 includes n CAM cells 10(1)–10(n) for storing an n-bit CAM word and a valid bit cell 20 for storing a valid bit for the row 2. Each of the CAM cells 10(1)–10(n) is coupled to associated match line ML. The valid bit cell 20 provides the valid bit stored therein to a corresponding match line control circuit 25. The match line control circuit 25 selectively pre-charges the match line ML in response to the valid bit.

The valid bit cell 20 may or may not be of the same type and configuration as the CAM cells 10. In some embodiments, the valid bit cell 20 is a memory element such as, for instance, a RAM, EPROM, or EEPROM cell. However, in other embodiments, the valid bit cell 20 is identical to the CAM cells 10, which may be a binary, ternary, or other suitable CAM cell. Although not shown in FIG. 2, in these other embodiments, the valid bit cell 20 may be coupled to the match line ML as the CAM cells 10 are coupled to the match line ML.

During compare operations between an n-bit comparand word and an n-bit CAM word stored in the CAM cells 10(1)–10(n), the match line ML is pre-charged via the match line control circuit 25 only if the valid bit stored in the valid bit cell 20 is asserted to indicate that a valid word is stored in the CAM cells 10. Accordingly, if the valid bit is asserted, the match line control circuit 25 pre-charges the match line ML to a predetermined potential to enable the match line ML to indicate the result of the compare operation. Thus, if any of the comparand bits do not match corresponding bits of the CAM word, the corresponding CAM cell(s) pulls the match line ML toward ground potential to indicate a mismatch condition.

If, on the other hand, the valid bit is de-asserted, thereby indicating that the row 2 contains invalid data, the match line control circuit 25 does not charge the match line ML to the predetermined potential, and forces a mismatch condition for that row. In some embodiments, the match line control circuit 25 pulls the match line ML toward ground potential to force a mismatch condition. Here, by disabling the match line ML in response to the de-asserted valid bit, the match line control circuit 25 precludes the result of the compare operation between the comparand word and the CAM word from asserting the match flag, thereby invalidating the CAM word without charging and then discharging the corresponding match line ML. Accordingly, by selectively pre-charging the match lines in response to the valid bits, present embodiments reduce power consumption during compare operations. The power savings realized by present embodiments are proportional to the percentage of CAM rows which typically contain invalid data. For instance, where a CAM array used in a data routing application is 70% full, selectively charging the match lines of the array in accordance with present embodiments can reduce power consumption associated with pre-charging the match lines during compare operations by approximately 30%.

Figure 1:
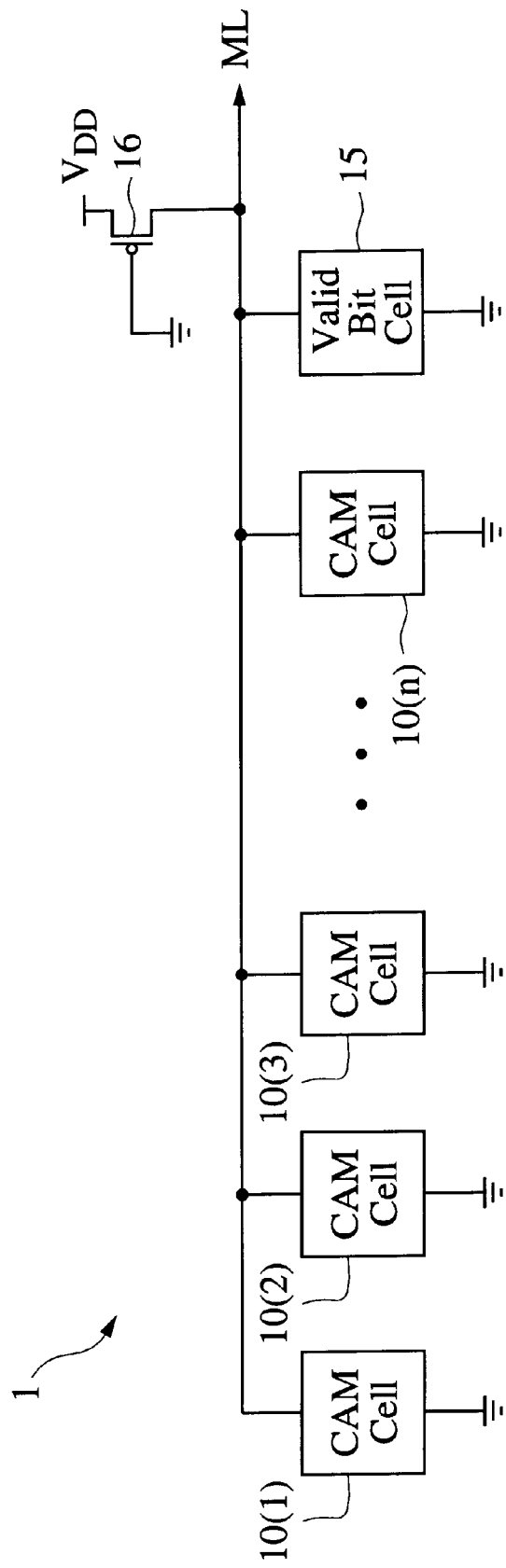
FIG. 1 is a block diagram of a row of a typical CAM array.

Further, unlike prior art techniques such as that described above with respect to FIG. 1, present embodiments do not need to compare the valid bit with a reference bit to determine whether the corresponding CAM word participates in the compare operation (i.e., whether result of a compare operation between the comparand word and the corresponding CAM word affects assertion of the match flag), but instead directly control such participation by either allowing or precluding charging of the match line ML. In alternate embodiments, the valid bit may be compared with reference bit in a comparand word.

In some embodiments, each row includes more than one valid bit cell 20 to allow for more than one valid bit per row. In these embodiments, a logical combination of the more than one valid bit determines whether the corresponding match line is pre-charged or not pre-charged.

Figure 3:
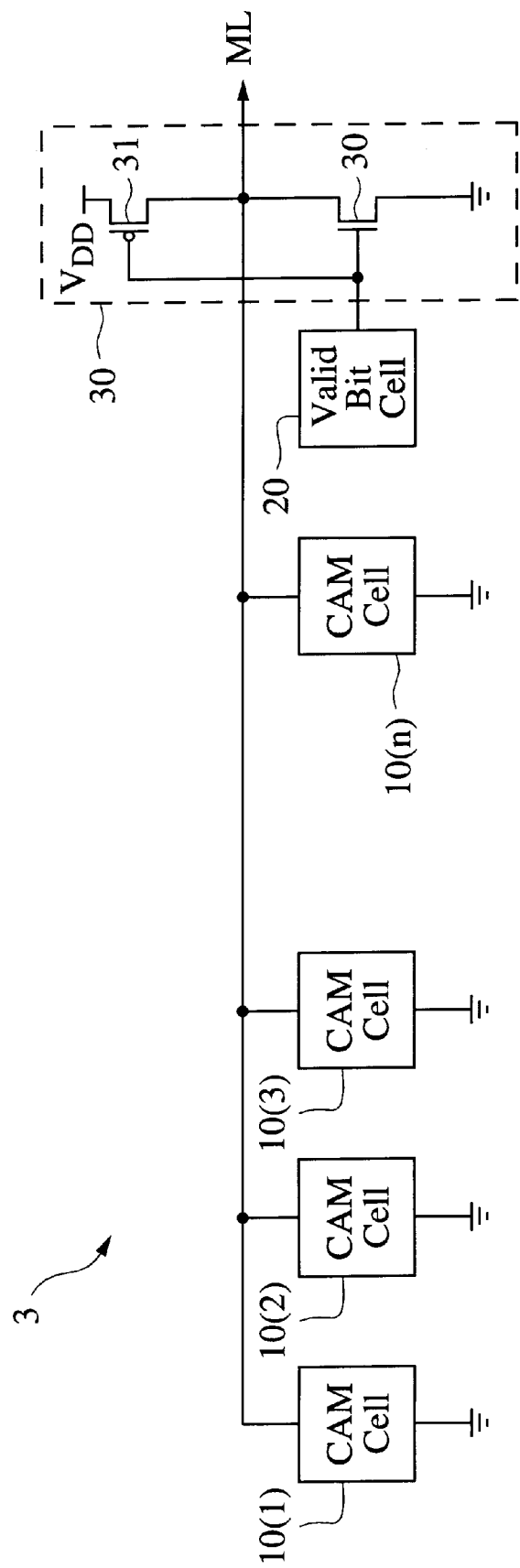
FIG. 3 shows a circuit diagram of the match line control circuit of FIG. 2 in one embodiment of the present invention.

FIG. 3 shows a CAM row 3 having a match line control circuit 30 that is one embodiment of the match line control circuit 25 of FIG. 2. The match line control circuit 30 includes a PMOS pull-up transistor 31 coupled between a supply voltage $V_{DD}$ and the match line ML, and an NMOS pull-down transistor 32 coupled between the match line ML and ground potential. The respective gates of the PMOS pull-up transistor 31 and NMOS pull-down transistor 32 are coupled to the valid bit cell 20 to receive the valid bit. Here, when the valid bit is asserted, the PMOS pull-up transistor 31 turns on and pre-charges the match line ML toward $V_{DD}$, and the NMOS pull-down transistor turns off and isolates the match line from ground potential. In this state, the match line control circuit 30 enables the match line ML to be responsive to the corresponding compare operation. When the valid bit is de-asserted, the PMOS pull-up transistor 31 turns off and therefore does not pre-charge the match line ML toward $V_{DD}$ and, in addition, the NMOS pull-down transistor 32 turns on and pulls the match line ML toward ground potential. In this state, the match line control circuit 30 disables the match line ML in response to the de-asserted valid bit by forcing a mismatch condition.

In other embodiments, the pull-up transistor 31 and the pull-down transistor 32 of the match line circuit 30 may be other suitable components such as a switch which selectively controls charging of the match line ML in response to the valid bit. Further, since in some embodiments the match line control circuit 30 acts as a pass gate by either enabling the match line ML to be responsive to the compare operation or forcing the match line ML to a mismatch condition, the match line control circuit 30 may be implemented using suitable logic circuits including, for instance, a multiplexer and an AND gate.

Figure 4:
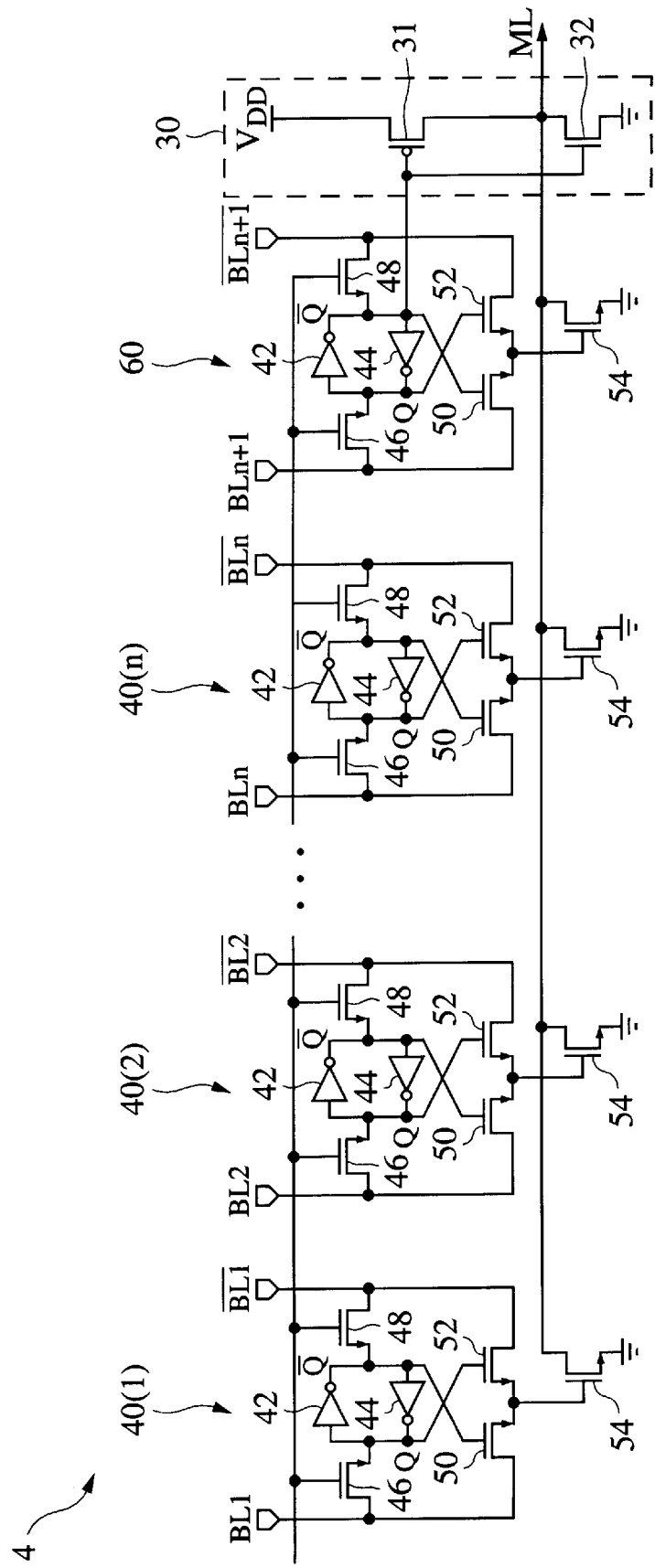
FIG. 4 is a circuit diagram of the CAM array and associated match line control circuit of FIG. 2 in another embodiment of the present invention.

As mentioned above, in some embodiments, the valid bit cell 20 is identical to the CAM cells 10. For example, FIG. 4 shows a CAM row 4 that is one embodiment of the CAM row 2 of FIG. 2. The row 4 includes n CAM cells 40(1)–40(n) for storing an n-bit CAM word, and a valid bit cell 60 for storing a valid bit, where the valid bit 60 is identical to the CAM cells 40. Each of the cells 40(1)–40(n) and 60 includes a latch formed by inverters 42 and 44 for storing a corresponding bit of a CAM word. Opposite sides of the latch are coupled to associated complementary bit lines BL and $\overline{BL}$ via pass transistors 46 and 48, respectively, where each such pass transistor has a gate coupled to the associated word line WL. The output terminal of the inverter 44 provides associated data bit Q to the gate of an NMOS pass transistor 52, and the output terminal of the inverter 42 provides the complementary data bit $\overline{Q}$ to the gate of an NMOS pass transistor 50. The pass transistor 52 is coupled between the associated complementary bit line $\overline{BL}$ and the gate of an NMOS pull-down transistor 54, and the pass transistor 50 is coupled between the associated bit line BL and the gate of the pull-down transistor 54. The pull-down transistor 54 is coupled between ground potential and the match line ML.

The output terminal of the inverter 42 of the valid bit cell 60 is coupled to the respective gates of the PMOS pull-up transistor 31 and the NMOS pull-down transistor 32 of the match line control circuit 30. In this manner, the complement of the valid bit is provided to the match line control circuit 30 which, in response thereto, selectively pre-charges the match line ML. Here, if the CAM cells 40(1)–40(n) store a valid CAM word, the valid bit is asserted to a logic high state. In this case, a logic one stored in the valid bit cell 60 forces the respective gates of the pull-up transistor 31 and the pull-down transistor 32 to logic low. Thus, the PMOS pull-up transistor 31 turns on and the NMOS transistor 32 turns off, thereby charging the match line ML to $V_{DD}$ to enable the match line ML. Conversely, if the CAM cells 40(1)–40(n) store an invalid CAM word, the valid bit is de-asserted to a logic low state. In this case, a logic zero stored in the valid bit cell 60 turns off the PMOS pull-up transistor 31 and turns on the NMOS transistor 32, thereby precluding charging of the match line ML and, thus, disabling the match line ML. As a result, present embodiments are able to invalidate CAM words without pre-charging corresponding match lines ML.

During compare operations of valid words, the word lines WL are grounded to turn off the pass transistors 46 and 48 within each of the CAM cells 40 (and the valid bit cell 60). Comparand bits of an n-bit comparand word to be compared with the CAM bits Q stored in respective CAM cells 40(1)–40(n) are provided to the associated bit lines BL, and the respective complementary comparand bits are provided to the associated complementary bit lines $\overline{BL}$. For each of the CAM word cells 40(1)–40(n), if the corresponding comparand bit matches the CAM bit Q, the gate of the corresponding pull-down transistor 54 is driven to logic low via transistors 50 or 52 so as to maintain the pull-down transistor 54 in a non-conductive state. This maintains the match line ML at $V_{DD}$ to allow the match line ML to indicate a match condition. If, on the other hand, any of the bit comparisons between the comparand word and the CAM word stored in the CAM cells 40(1)–40(n) mismatch, the corresponding pull-down transistor 54 turns on and discharges the match line ML to ground potential, thereby disabling the match line ML.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention. For instance, in some embodiments, the row 4 shown in FIG. 4 is modified to include comparand bit lines CL and complementary comparand bit lines $\overline{CL}$ to provide the comparand bits to the CAM cells 40 during compare operations. Further, although discussed above in the context of FIG. 4 as having a logic one value to indicate valid data and a logic zero to indicate invalid data, in other embodiments the logic states of the valid bit may be reversed such that, for instance, a logic one indicates invalid data and a logic zero indicates valid data.

What is claimed is:

1. A method for selectively pre-charging a match line of a corresponding row of a content addressable memory (CAM) array, the row including a valid bit indicative of whether valid data is stored therein, the method comprising:

providing the valid bit to a match line control circuit associated with the row of the CAM array; and selectively pre-charging the match line in response to the valid bit.

2. The method of claim 1, wherein the match line is selectively pre-charged in response to the valid bit without comparing the valid bit to a reference bit.

3. The method of claim 1, wherein the match line is charged only when the valid bit indicates that the row contains valid data.

4. The method of claim 3, wherein a charged match line allows the result of a compare operation between a comparand word and data stored in the row to affect assertion of a match flag.

5. The method of claim 1, wherein the match line is not charged when the valid bit indicates that the row contains invalid data.

6. The method of claim 5, wherein the match line is maintained at a predetermined potential.

7. The method of claim 5, wherein the predetermined potential comprises ground potential.

8. The method of claim 6, wherein the valid bit forces a mismatch condition during a compare operation between a comparand word and data stored in the row.

9. The method of claim 1, further comprising:

asserting the valid bit when data stored in the row is valid; and de-asserting the valid bit when data stored in the row is invalid.

10. A method for selectively enabling match lines of corresponding rows of a CAM array, each row of the CAM array including a valid bit indicative of whether valid data is stored in the row, the method comprising selectively enabling each match line in response to its corresponding valid bit to allow the results of a compare operation between a comparand word and data stored in each corresponding row of the CAM array to affect logical states of the respective match lines.

11. The method of claim 10, further comprising:

asserting the valid bits corresponding to rows containing valid data; and pre-charging the match lines corresponding to the asserted valid bits.

12. The method of claim 10, further comprising:

de-asserting the valid bits corresponding to rows containing invalid data; and discharging the match lines corresponding to the de-asserted valid bits.

13. The method of claim 12, wherein the de-asserted valid bits force mismatch conditions during respective compare operations between a comparand word and data stored in corresponding rows of the CAM array without comparing the de-asserted valid bits with a reference bit.

14. A content addressable memory (CAM) comprising:

a plurality of rows each having a plurality of CAM cells coupled to a corresponding match line;

a plurality of valid bit cells each for storing a valid bit indicating whether a corresponding one of the plurality of rows of the CAM contains valid data; and a plurality of match line control circuits each having a first terminal coupled to a corresponding valid bit cell and having a second terminal coupled to a corresponding match line.

15. The CAM of claim 14, wherein the match line control circuits selectively pre-charge the match lines in response to the valid bits.

16. The CAM of claim 15, wherein the valid bit cells comprise memory cells.

17. The CAM of claim 15, wherein the valid bit cells comprise CAM cells.

18. The CAM of claim 15, wherein the match line control circuit comprises a pull-up transistor coupled between the match line and a first supply voltage terminal and having a gate coupled to receive the valid bit.

19. The CAM of claim 18, wherein the pull-up transistor charges the match line towards a predetermined potential when that the corresponding row contains valid data.

20. The CAM of claim 18, wherein the match line control circuit further comprises a pull-down transistor coupled between the match line and ground potential and having a gate coupled to receive the valid bit.

21. The CAM of claim 20, wherein the pull-down transistor pulls the match line towards ground potential when the valid bit indicates that the corresponding row contains invalid data.

22. The CAM of claim 20, wherein the pull-up transistor comprises a PMOS transistor and the pull-down transistor comprises an NMOS transistor.

23. A content addressable memory (CAM) comprising:

a plurality of rows each having a plurality of CAM cells coupled to a corresponding match line;

a plurality of valid bit cells each for storing a valid bit indicating whether a corresponding one of the plurality of rows of the CAM contains valid data; and means for selectively pre-charging the match line in response to the valid bit.

24. The CAM of claim 23, wherein the means for selectively pre-charging comprises a pull-up transistor coupled between the match line and a first supply voltage terminal and having a gate responsive to the valid bit.

25. The CAM of claim 24, wherein the means for selectively pre-charging further comprises a pull-down transistor coupled between the match line and a second supply voltage terminal and having a gate responsive to a complement of the valid bit.

26. The CAM of claim 24, wherein the first supply voltage terminal is coupled to a positive voltage and the second supply voltage terminal is coupled to ground potential.

27. The CAM of claim 25, further comprising:

means for asserting the valid bit when data stored in the row is valid and de-asserting the valid bit when data stored in the row is invalid.

28. The CAM of claim 25, wherein the pull-up transistor comprises a PMOS transistor and the pull-down transistor comprises an NMOS transistor.

* * * * *